(12) United States Patent
Keshtbod et al.

(10) Patent No.: US 10,515,681 B1
(45) Date of Patent: Dec. 24, 2019

(54) POWER-EFFICIENT PROGRAMMING OF MAGNETIC MEMORY

(71) Applicant: Avalanche Technology, Inc., Fremont, CA (US)

(72) Inventors: Parviz Keshtbod, Los Altos Hills, CA (US); Ebrahim Abedifard, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 16/002,828

(22) Filed: Jun. 7, 2018

(51) Int. Cl.
*G11C 11/16* (2006.01)
*H01L 43/08* (2006.01)
*H01L 27/22* (2006.01)

(52) U.S. Cl.
CPC ........ *G11C 11/1675* (2013.01); *G11C 11/161* (2013.01); *G11C 11/1673* (2013.01); *H01L 27/224* (2013.01); *H01L 43/08* (2013.01)

(58) Field of Classification Search
None
See application file for complete search history.

(56) References Cited

U.S. PATENT DOCUMENTS

| | | | | |
|---|---|---|---|---|
| 2006/0044878 A1* | 3/2006 | Perner | ................ | G11C 13/0011 365/73 |
| 2007/0091671 A1* | 4/2007 | Ooishi | ................... | G11C 11/16 365/158 |
| 2016/0291870 A1* | 10/2016 | Debrosse | ............ | G11C 11/1675 |
| 2017/0084322 A1* | 3/2017 | Wang | ....................... | G11C 11/16 |
| 2017/0365317 A1 | 12/2017 | Berger et al. | | |

OTHER PUBLICATIONS

Tianhao Zheng, Jaeyoung Park, Michael Orshansky, Mattan Erez, "Variable-Energy Write STT-RAM Architecture with Bi-Wise Write-Completion Monitoring," IEEE Proceedings of ISLPED13, 2013.

* cited by examiner

*Primary Examiner* — James G Norman
(74) *Attorney, Agent, or Firm* — Bing K. Yen

(57) ABSTRACT

The present invention is directed to a method for programming a memory cell that includes a two-terminal selector and a memory element coupled in series between a first conductive line and a second conductive line. The method includes the steps of applying a voltage across the memory cell with the voltage being sufficiently high to enable switching of the memory element from initial resistance state to target resistance state; determining the initial resistance state of the memory element; comparing the initial resistance state with the target resistance state; and if the initial resistance state and the target resistance state are same, concluding that the memory element is already in the target resistance state and terminating programming process; otherwise, continually monitoring the voltage until a change in the voltage is detected and then concluding that the memory element has switched to the target resistance state and terminating the programming process.

8 Claims, 6 Drawing Sheets

POWER-EFFICIENT PROGRAMMING OF MAGNETIC MEMORY

BACKGROUND

The present invention relates to a method for using magnetic memory, and more particularly, to a programming method for magnetic memory that reduces power consumption.

A resistance-based memory device normally comprises an array of memory cells, each of which includes a memory element and a selection element, such as transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram of a memory array 20, which comprises a plurality of memory cells 22 with each of the memory cells 22 including an access transistor 24 coupled to a resistance-based memory element 26; a plurality of parallel word lines 28 with each being coupled to the gates of a respective row of the access transistors 24 in a first direction; a plurality of parallel bit lines 30 with each being coupled to a respective row of the memory elements 26 in a second direction substantially perpendicular to the first direction; and a plurality of parallel source lines 32 with each being coupled to a respective row of the access transistors 24 in the first or second direction.

Alternatively, the access transistors 24 of the memory cells 22 may be replaced by two-terminal bi-directional selectors to simplify the wiring scheme and allow stacking of multiple levels of memory arrays. FIG. 2 is a schematic circuit diagram of a memory array 40 incorporating therein two-terminal selectors as selection elements. The memory array 40 comprises a plurality of memory cells 42 with each of the memory cells 42 including a two-terminal bi-directional selector 44 coupled to a resistance-based memory element 46 in series; a plurality of first conductive lines 48A-48C with each being coupled to a respective row of the memory elements 46 in a first direction; and a plurality of second conductive lines 50A-50C with each being coupled to a respective row of the two-terminal selectors 44 in a second direction substantially perpendicular to the first direction. Accordingly, the memory cells 42 are located at the cross points between the first and second conductive lines 48A-48C and 50A-50C. The first and second conductive lines 48A-48C and 50A-50C may be bit lines and word lines, respectively, or vice versa. Multiple layers of the memory array 40 may be stacked on a wafer substrate to form a monolithic three-dimensional memory device.

The resistance-based memory elements 26 or 46 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage. The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). When a switching current or voltage is applied to the MTJ, the magnetization direction of the magnetic free layer is switched with respect to the magnetization direction of the magnetic reference layer, thereby changing the electrical resistance of the MTJ.

Because of variations caused by the manufacturing process and the inherent stochastic switching behavior of MTJ, an array of magnetic memory cells may exhibit large variations in the actual programming time required to switch the resistance state. The wide distribution in programming time means that a small fraction of slower cells will required programming times that are several times longer than the rest of the cells. Therefore, the slower cells prolong the programming time for all cells in a conventional programming method that uses a fixed time period to program all cells, thereby adversely increasing power consumption.

For the foregoing reasons, there is a need for an efficient programming method that can reduce power consumption.

SUMMARY

The present invention is directed to a method for programming a memory cell that includes a two-terminal selector and a memory element coupled in series between a first conductive line and a second conductive line. The programming method includes the steps of applying a voltage across the memory cell with the voltage being sufficiently high to enable switching of the memory element from initial resistance state to target resistance state; determining the initial resistance state of the memory element; comparing the initial resistance state with the target resistance state; if the initial resistance state and the target resistance state are same, concluding that the memory element is already in the target resistance state and terminating programming process; and if the initial resistance state and the target resistance state are different, continually monitoring the voltage until a change in the voltage is detected and then concluding that the memory element has switched to the target resistance state and terminating the programming process. The programming method may further include the step of concluding that the memory element is defective and terminating the programming process if the initial resistance state and the target resistance state are different and no substantial change in the voltage is detected after a time period.

According to another aspect of the present invention, a memory device includes a memory element and a two-terminal selector coupled in series between a first conductive line and a second conductive line; a first sense amplifier operable to connect to the first conductive line; and a second sense amplifier operable to connect to the first and second conductive lines. The memory element may include a magnetic tunnel junction (MTJ).

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Figure 1:
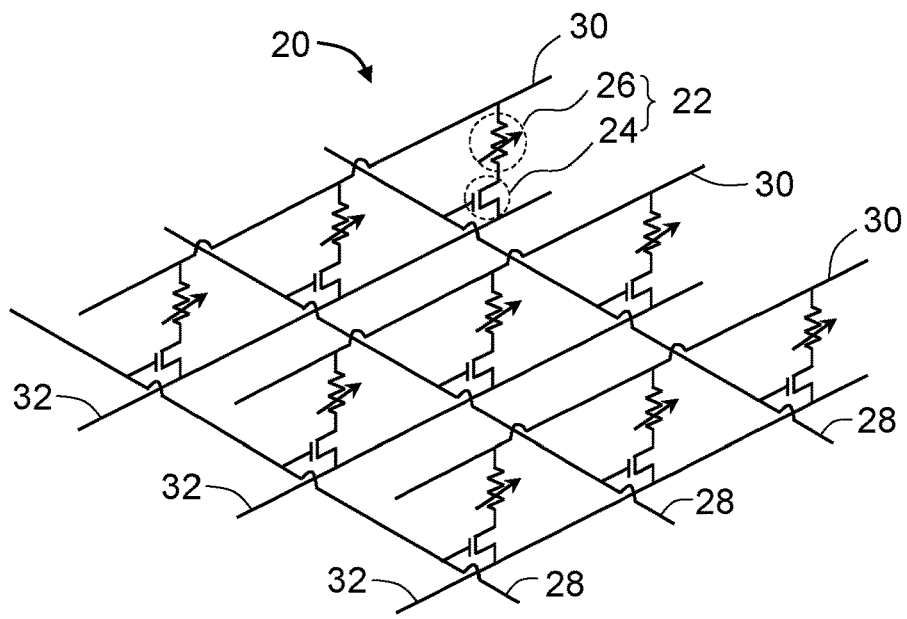
FIG. 1 is a schematic circuit diagram for an array of memory cells, each of which includes an access transistor and a resistance-based memory element coupled in series.
Figure 2:
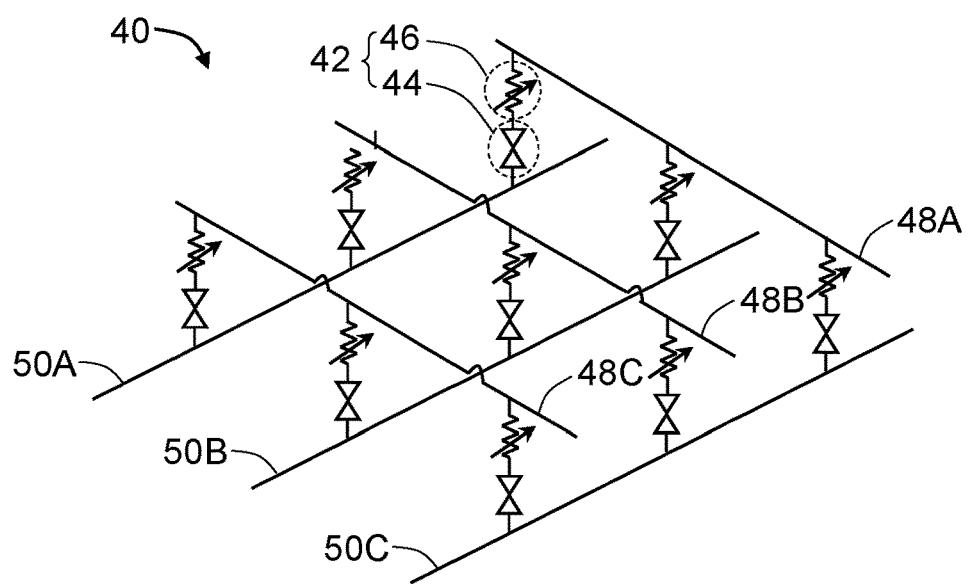
FIG. 2 is a schematic circuit diagram for an array of memory cells, each of which includes a two-terminal selector and a resistance-based memory element coupled in series.
Figure 3:
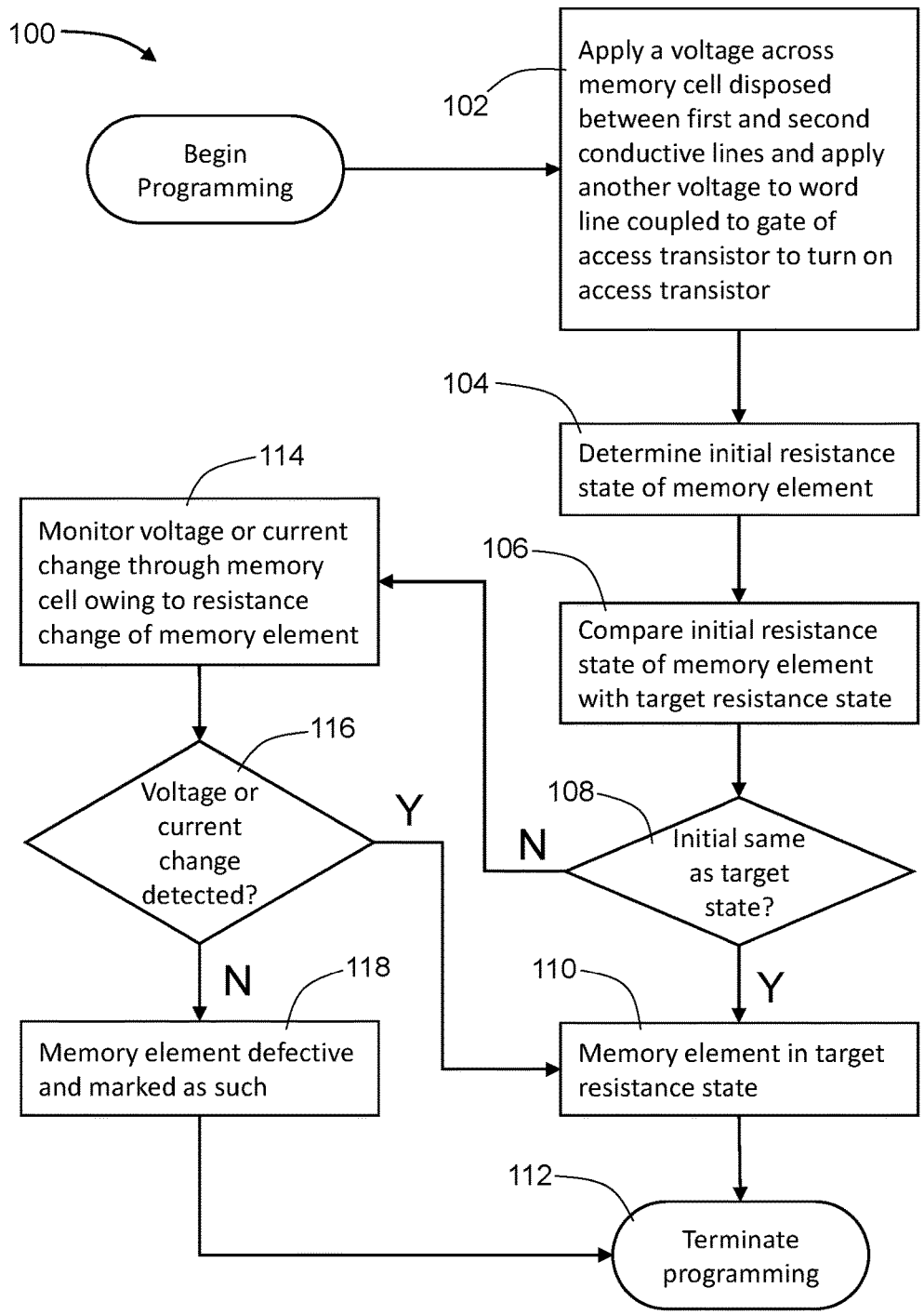
FIG. 3 is a flow chart illustrating selected steps for programming a memory cell, which includes an access transistor and a memory element coupled in series, in accordance with an embodiment of the present invention.

FIG. 3 is a flow chart illustrating a method embodiment of the present invention as applied to a memory cell that includes an access transistor and a resistance-based memory element coupled in series. The memory element may be switched by phase change mechanism, formation and dissolution of conductive filaments, changing of magnetization direction, or any combination thereof. The selected steps 100 for programming the memory element of a memory cell are described with reference to an exemplary memory circuitry 150, as illustrated in FIG. 4, that may be used to practice the present invention.

Figure 4:
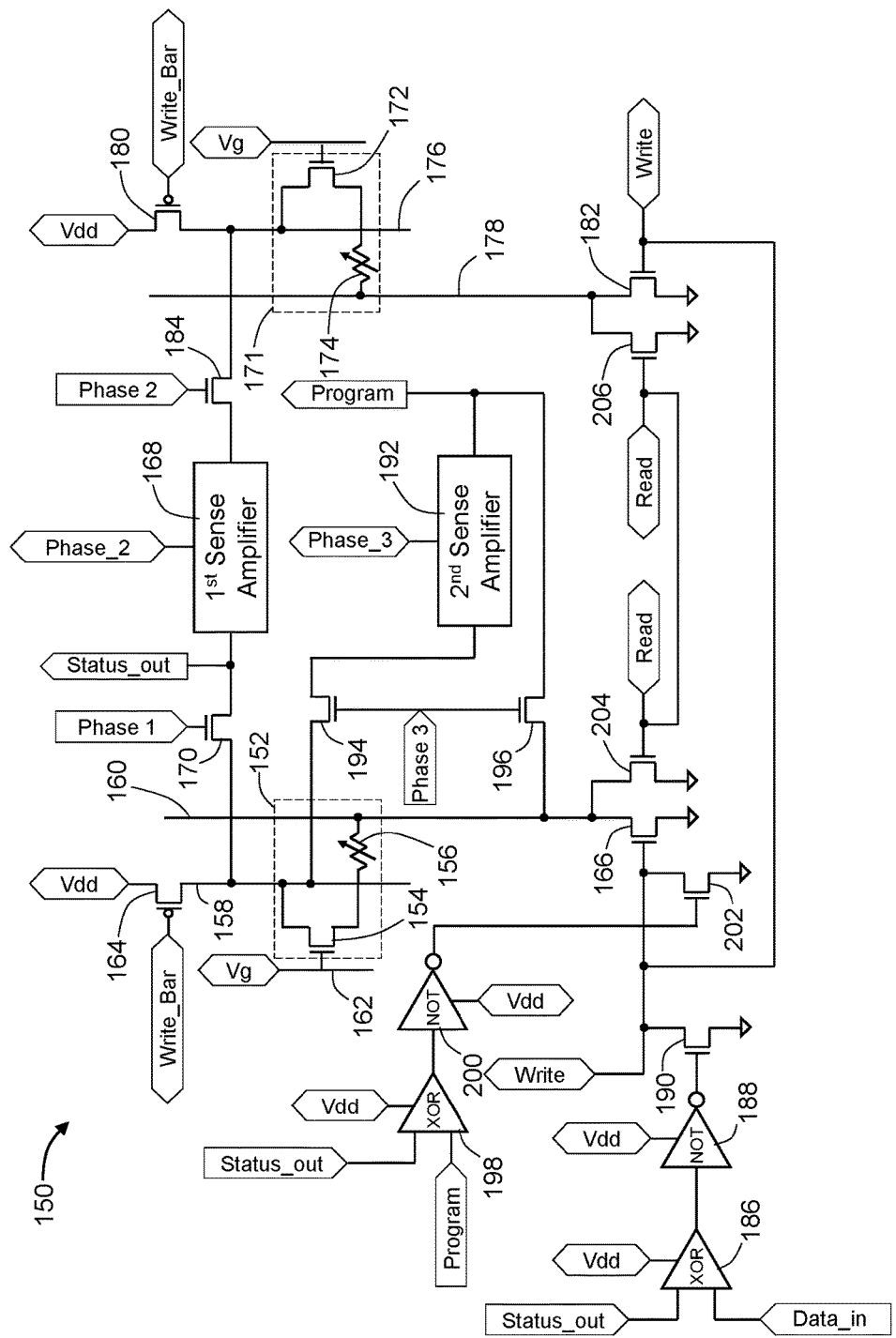
FIG. 4 is a diagram illustrating a memory circuitry that can be used to practice the present invention.

The memory circuitry 150 of FIG. 4 includes a memory cell 152 comprising an access transistor 154 and a resistance-based memory element 156 coupled in series between a first conductive line 158 and a second conductive line 160. The first and second conductive lines 158 and 160 may function as bit line and source line, respectively, or vice versa. A word line 162 is connected to the gate of the access transistor 154.

In an embodiment, the memory element 156 includes a magnetic tunnel junction (MTJ) that may be switched by applying a voltage thereto or a current therethrough. In another embodiment, the memory element 156 includes a phase change chalcogenide compound, which can switch between a resistive phase (amorphous or crystalline) and a conductive crystalline phase. In still another embodiment, the memory element 156 includes a nominally insulating metal oxide material, which can switch to a lower electrical resistance regime as metal rich precipitates grow and link to form conductive paths upon application of an appropriate voltage.

The selected steps 100 for programming the memory element 156 from an initial resistance state to a target resistance state begins by applying a voltage (i.e., Vg) to the word line 162 to turn on or activate the access transistor 154 and by applying another voltage across the memory cell 152 at step 102. The voltage across the memory cell 152 may be applied by, for example, connecting the first conductive line 158 to a power supply (i.e., Vdd) through a pull-up transistor 164 and connecting the second conductive line 160 to ground through a pull-down transistor 166. Accordingly, the voltage of the first conductive line 158 may be lower than Vdd and the voltage of the second conductive line 160 may be higher than 0 V.

With the access transistor 154, the pull-up transistor 164, and the pull-down transistor 166 all activated to impose a voltage across the memory cell 152 at step 102, the initial resistance state of the memory element 156 is then verified or ascertained at step 104. The initial resistance state of the memory element 156 may be verified by, for example, comparing the voltage of the first conductive line 158, which may be connected to a first sense amplifier 168 through another transistor 170, to a reference voltage. The reference voltage for the first sense amplifier 168 may be provided by, for example, a reference cell 171, which includes an access transistor 172 and a reference resistor 174 coupled in series between another first conductive line 176 and another second conductive line 178. The reference resistor 174, which may be a variable resistor like the memory element 156 or a resistor with substantially fixed resistance, may have a resistance value that is somewhere in between the high and low resistance values of the memory element 156. The first conductive line 176 may be connected to the power supply (i.e., Vdd) through another pull-up transistor 180 and the second conductive line 178 may be connected to ground through another pull-down transistor 182, thereby imposing a voltage across the reference cell 171. The first conductive line 176 may provide the reference voltage to the first sense amplifier 168 through a transistor 184. If the voltage of the first conductive line 158 connected to the memory cell 152 is higher than the voltage of the first conductive line 176 connected to the reference cell 171, then the initial resistance state of the memory element 156 is in the high resistance regime. Otherwise, the initial resistance state of the memory element 156 is in the low resistance regime. After comparing the voltages by the first sense amplifier 168 to determine whether the initial resistance state of the memory element 156 is in the high or low resistance regime, the initial resistance state, in the form of voltage, is latched in the first sense amplifier 168, which may then be disconnected from the first conductive line 158 by deactivating the transistor 170.

After step 104, the initial resistance state of the memory element 156 is compared with the target resistance state at step 106, which may be carried out by comparing the voltage signal ("Status_out") latched in the first sense amplifier 168 and the "Data_in" signal. Next, at step 108, where a decision is made as to whether the initial resistance state and the target resistance state correspond to the same resistance regime (i.e., both high or both low) or different resistance regimes (i.e., one high and one low). If the initial and target resistance states both correspond to the same resistance regime (i.e., both high or both low), the process continues to step 110 by concluding that the memory element 156 is already in the target resistance state, after which the programming process is terminated at step 112 by deactivating the pull-up transistor 164, or deactivating the pull-down transistor 166, or removing the applied voltage Vg on the word line 162, or any combination thereof. Otherwise, the process continues to step 114.

Steps 106-112 may be carried out by a first XOR gate 186 and a first NOT gate (inverter) 188 connected in series. The input of the first XOR gate 186 is connected to the "Status_out" and "Data_in" signals. The output of the first NOT gate 188 is connected to the gate of a transistor 190, whose source and drain are connected to ground and the gate of the pull-down transistor 166, respectively. When the "Status_out" and "Data_in" signals are the same (i.e., both high or both low), the transistor 190 will be activated, thereby deactivating the pull-down transistor 166 by lowering the gate voltage thereof. When the "Status_out" and "Data_in" signals are different, the transistor 190 will be deactivated and the pull-down transistor 166 will remain activated to allow the continuation of the programming process.

At step 114, where the initial and target resistance states correspond to different resistance regimes, the process proceeds by monitoring change in memory cell voltage or current through the memory cell 152 owing to switching of the memory element 156. The change in the cell voltage or current may be detected by, for example, comparing the voltages of the first and second conductive lines 158 and 160, which are connected to a second sense amplifier 192 through two transistors 194 and 196, respectively. When the memory element 156 switches from the high to low resistance regime, the voltage of the first conductive line 158 decreases and the voltage of the second conductive line 160 increases. Conversely, when the memory element 156 switches from the low to high resistance regime, the voltage of the first conductive line 158 increases and the voltage of the second conductive line 160 decreases.

After step 114, the process continues to step 116, where a decision is made as to whether a change in the cell voltage or current owing to switching of the memory element 156 is detected. If the change in the cell voltage or current is detected, indicating that the resistance regime of the initial resistance state has switched to the resistance regime of the target resistance state, the process advances to step 110 and is then terminated at step 112. If no change in the cell voltage or current owing to switching of the memory element 156 is detected after a time period, indicating that the memory element 156 has not switched, the process may advance to step 118, where the memory element 156 is marked as defective or difficult to switch. After step 118, the programming process is terminated at step 112. In an alternative embodiment, step 118 may be omitted by directly terminating the programming process at step 112 after no change in the cell voltage or current is detected after a time period at step 116.

Steps 114, 116, 110, and 112 may be carried out by using the second sense amplifier 192, which is connected to the first and second conductive lines 158 and 160. For example, assuming the initial and target resistance states corresponding to the low and high resistance regimes, respectively, when the memory element 156 switches from the low to high resistance regime, the voltage of the first conductive line 158 increases and the voltage of the second conductive line 160 decreases, thereby lowering the voltage signal of "Program". Both "Program" and "Status_out" signals are low and are connected to a second XOR gate 198, which is connected to a second NOT gate 200. The output of the second NOT gate 200 is connected to a transistor 202, whose source and drain are connected to ground and the gate of the pull-down transistor 166, respectively. Since the output of the second NOT gate 200 is high, the transistor 202 will be activated, thereby deactivating the pull-down transistor 166 and terminating the programming process by pulling down the gate voltage of the pull-down transistor 166.

The programming process steps 102-110 and 114-116 may be carried out with the access transistor 154, the pull-up transistor 164, and the pull-down transistor 166 all activated to impose a voltage across the memory cell 152. For a programming process that is terminated at step 112 without detecting a change in the cell voltage or current at step 116 (i.e., the memory element 156 being difficult to switch), the programming process 100 sans steps 104 and 106 may repeat one or more times until the memory element 156 switches.

While the exemplary memory circuitry 150 shows one memory cell 152 being connected to the first and second sense amplifiers 168 and 192, multiple memory cells (not shown) may be connected to the sense amplifiers 168 and 192 through multiplexers (not shown) as understood by those skilled in the art. Moreover, the polarity of the applied voltage to the memory cell 152 may be reversed by using a pull-up transistor (not shown), which is connected to Vdd and in parallel to the pull-down transistor 166, and a pull-down transistor (not shown), which is connected to ground and in parallel to the pull-up transistor 164. In a normal read or sensing operation, alternate pull-down transistors 204 and 206 that limit the current flow may be used instead of the pull-down transistors 166 and 182, respectively.

Figure 5:
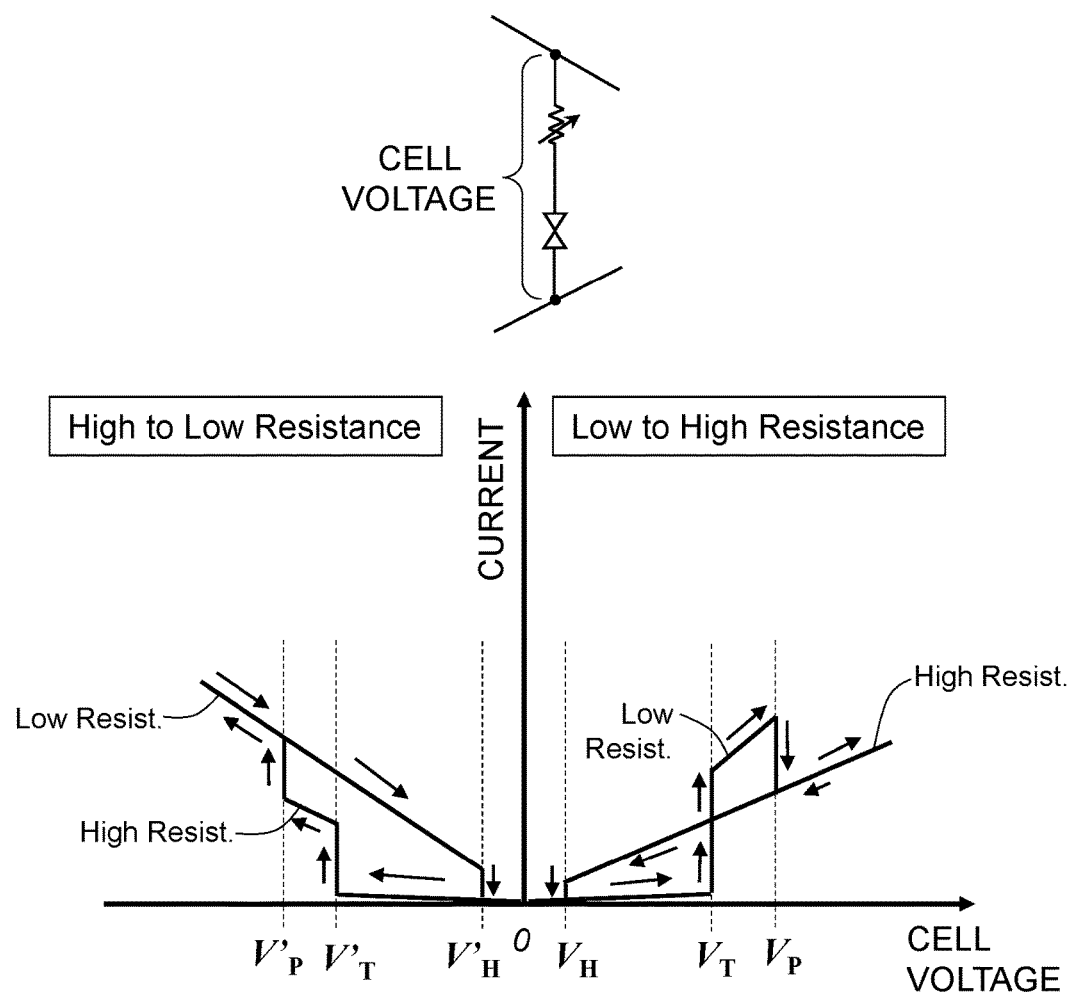
FIG. 5 is an I-V response plot of a memory cell comprising a two-terminal selector and an MTJ memory element coupled in series.

The present invention may also be applied to a memory cell comprising a two-terminal selector and a memory element coupled in series. FIG. 5 shows an exemplary current-voltage (I-V) response plot for a memory cell comprising a bidirectional two-terminal selector and an MTJ memory element coupled in series. The MTJ memory element may switch from the low to high resistance regime by applying a programming voltage of $V_P$ to the memory cell. Initially, the current may slightly increase as the cell voltage increases from zero to near a threshold voltage, $V_T$. At or near $V_T$, the current rapidly increases and exhibits a highly non-linear behavior, indicating a transition of the selector from a nominally insulative or "off" state to a nominally conductive or "on" state. As the cell voltage continues to increase beyond $V_T$, the current increases and follows the low resistance curve, which may be mostly governed by the low resistance regime of the MTJ memory element, until reaching $V_P$, at which the MTJ memory element switches the resistance state from the low to high resistance regime, thereby increasing the cell resistance and lowering the current. As the cell voltage continues to increase beyond $V_P$, the current increases and follows the high resistance curve, which may be mainly governed by the high resistance regime of the MTJ memory element. As the cell voltage decreases from $V_P$ to near a holding voltage, $V_H$, which is lower than $V_T$, the current decreases and follows the high resistance curve. At or near $V_H$, the current rapidly decreases and exhibits a highly non-linear behavior, indicating a transition of the selector from the nominally conductive state back to the nominally insulative state. As the cell voltage continues to decrease beyond $V_H$, the current flow slightly decreases until stopping at about 0 V. Therefore, the selector is a volatile device that requires the continuing application of a voltage to be conductive.

With continuing reference to FIG. 5, the MTJ memory element may switch from the high to low resistance regime by applying a programming voltage of $V'_P$ with opposite polarity to the memory cell. As the cell voltage increases, the current rapidly increases at or near $V'_T$ as the selector turns on or becoming conductive. At or near $V'_P$, the MTJ memory element switches from the high to low resistance regime, thereby decreasing the cell resistance and increasing the current.

Figure 6:
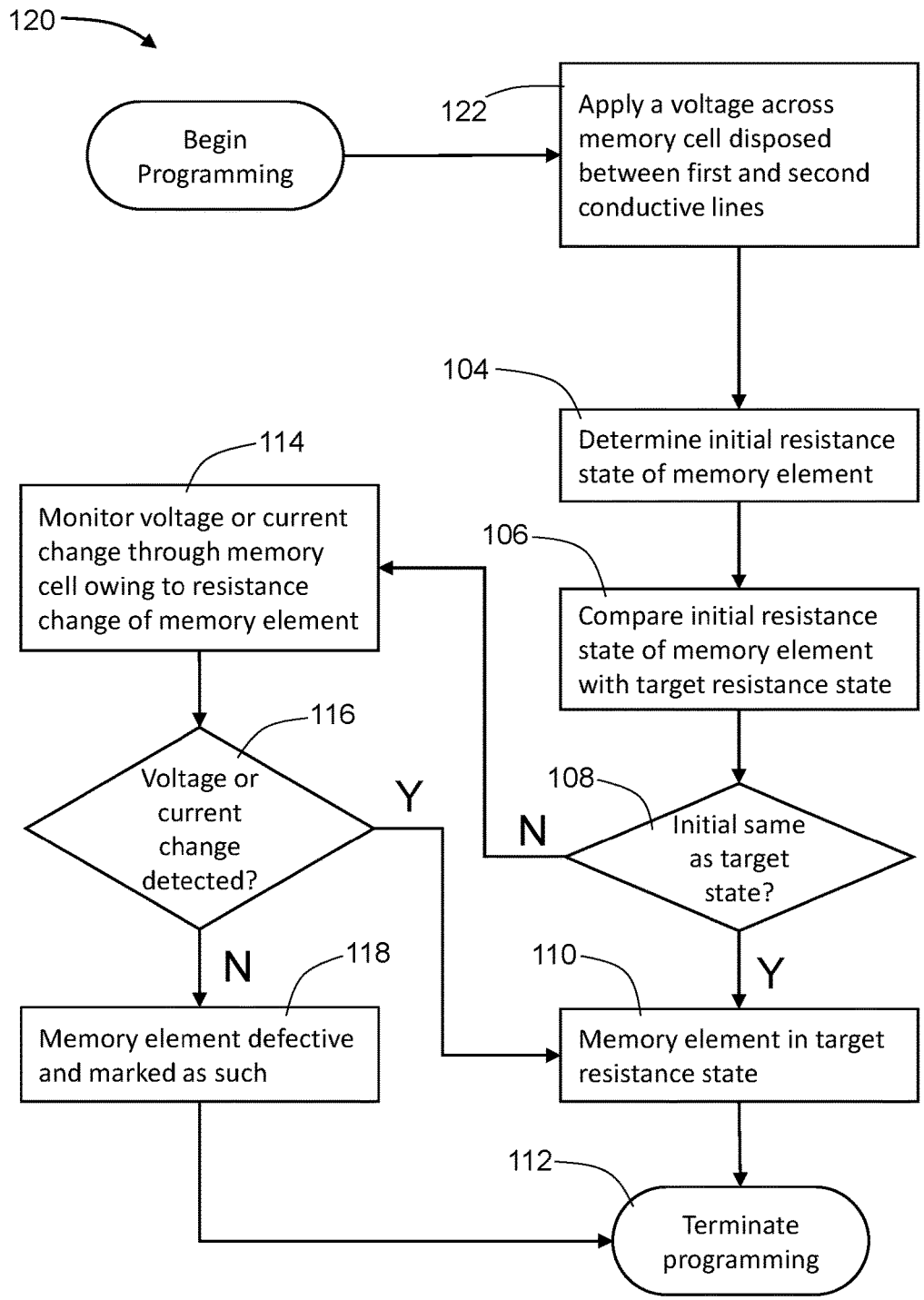
FIG. 6 is a flow chart illustrating selected steps for programming a memory cell, which includes a two-terminal selector and a memory element coupled in series, in accordance with another embodiment of the present invention.
Figure 7:
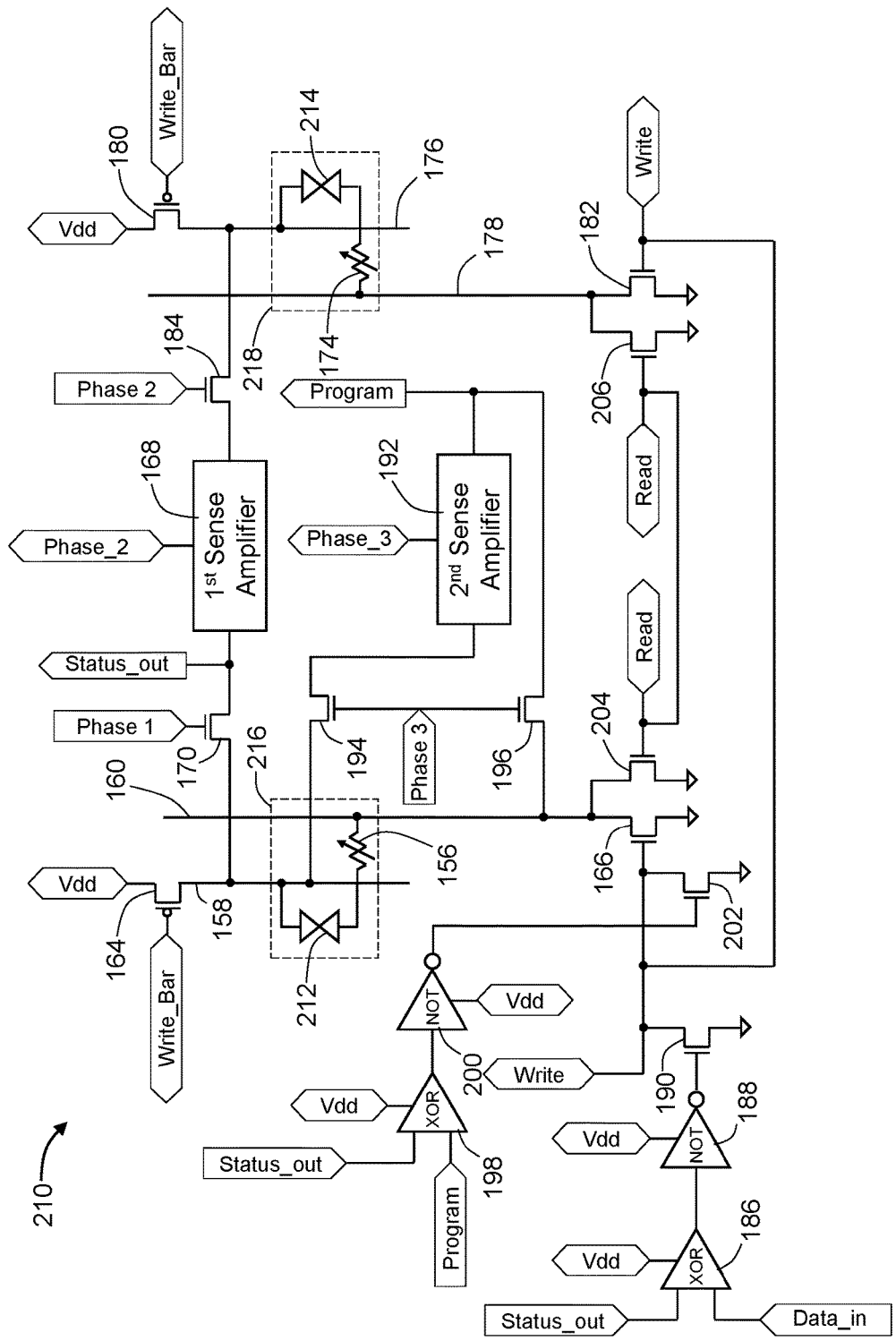
FIG. 7 is a diagram illustrating another memory circuitry that can be used to practice the present invention.

FIG. 6 is a flow chart illustrating a method embodiment of the present invention as applied to a memory cell that includes a two-terminal selector and a resistance-based memory element coupled in series. The memory element may be switched by phase change mechanism, formation and dissolution of conductive filaments, changing of magnetization direction, or any combination thereof. The selected steps 120 for programming the memory element of the memory cell are described with reference to an exemplary memory circuitry 210, as illustrated in FIG. 7, that may be used to practice the present invention.

The memory circuitry 210 is similar to the memory circuitry 150 described above except the access transistors 154 and 172 and word lines coupled thereto are replaced by selectors 212 and 214. In FIG. 7, numerals 156-170 and 174-206 denote the same components as those shown in FIG. 4. The memory cell 216 is coupled to the first conductive line 158 at one end and the second conductive line 160 at the other end. The first and second conductive lines 158 and 160 may function as bit line and word lines, respectively, or vice versa. The connection sequence of the selector 212 and the memory element 156 may be reversed such that the memory element 156 is coupled to the first conductive line 158 while the selector 212 is coupled to the second conductive line 160. Similarly, the reference cell 218 is coupled to the first conductive line 176 at one end and the second conductive line 178 at the other end.

Referring back to FIG. 6, the programming process 120 for the memory cell 216 using the selector 212 is analogous to the programming process 100 illustrated in FIG. 3 and described above except for the first step 122, where the process begins by applying a voltage greater than $V_T$ across the memory cell 216. The voltage across the memory cell 216 may be applied by, for example, connecting the first conductive line 158 to a power supply (i.e., Vdd) through the pull-up transistor 164 and connecting the second conductive line 160 to ground through the pull-down transistor 166. The programming process 120 may be terminated by lowering the cell voltage to zero or a value below $V_H$. Steps 104-118 for the rest of the programming process are analogous to those illustrated in FIG. 3 and described above.

Compared with the prior art method, the present invention allows early termination of a programming process when switching of the resistance state of the memory element has occurred, thereby reducing the power consumption of the memory device.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, 6. In particular, the use of "step of" in the claims herein is not intended to invoke the provisions of 35 U.S.C. § 112, 6.

What is claimed is:

1. A method for programming a memory cell that includes a two-terminal selector and a memory element coupled in series between a first conductive line and a second conductive line, the method including the steps of:
   applying a voltage across the memory cell, the voltage being sufficiently high to enable switching of the memory element from an initial resistance state to a target resistance state;
   determining the initial resistance state of the memory element;
   comparing the initial resistance state with the target resistance state;
   if the initial resistance state and the target resistance state are same, concluding that the memory element is already in the target resistance state and terminating programming process; and
   if the initial resistance state and the target resistance state are different, continually monitoring the voltage until a change in the voltage is detected and then concluding that the memory element has switched to the target resistance state and terminating the programming process,
   wherein the step of determining the initial resistance state of the memory element is carried out by a first sense amplifier and the step of continually monitoring the voltage is carried out by a second sense amplifier.

2. The method of claim 1, wherein the first sense amplifier is operable to connect to the first conductive line.

3. The method of claim 1, wherein the second sense amplifier is operable to connect to the first conductive line and the second conductive line.

4. The method of claim 1, wherein the first sense amplifier is operable to connect to the first conductive line and the second sense amplifier is operable to connect to the first conductive line and the second conductive line.

5. The method of claim 4, wherein the two-terminal selector is disposed adjacent to the first conductive line and the memory element is disposed adjacent to the second conductive line.

6. The method of claim 4, wherein the two-terminal selector is disposed adjacent to the second conductive line and the memory element is disposed adjacent to the first conductive line.

7. The method of claim 1, wherein the memory element includes a magnetic tunnel junction (MTJ).

8. The method of claim 1, wherein the step of applying a voltage across the memory cell is performed by activating a pull-up transistor coupled to the first conductive line and a pull-down transistor coupled to the second conductive line.

\* \* \* \* \*